United States Patent [19]

Mills et al.

[11] Patent Number: 5,504,875

[45] Date of Patent: Apr. 2, 1996

[54] NONVOLATILE MEMORY WITH A PROGRAMMABLE OUTPUT OF SELECTABLE WIDTH AND A METHOD FOR CONTROLLING THE NONVOLATILE MEMORY TO SWITCH BETWEEN DIFFERENT OUTPUT WIDTHS

[75] Inventors: Duane R. Mills, Folsom; Peter K. Hazen, Sacramento, both of Calif.

[73] Assignee: Intel Corporation, Santa Clara, Calif.

[21] Appl. No.: 32,686

[22] Filed: Mar. 17, 1993

[51] Int. Cl.$^6$ ................................................. G06F 12/00
[52] U.S. Cl. .............................. 395/497.02; 364/DIG. 1; 365/189.02
[58] Field of Search .................................. 395/425, 325, 395/800, 497.01, 497.02; 365/238.5, 230.03, 230.04, 189.02; 370/99

[56] References Cited

U.S. PATENT DOCUMENTS

| | | | |
|---|---|---|---|
| 4,667,305 | 5/1987 | Dill et al. | 395/325 |
| 5,165,037 | 11/1992 | Culley | 395/800 |
| 5,262,990 | 11/1993 | Mills et al. | 365/189.02 |
| 5,293,381 | 3/1994 | Choy | 370/99 |
| 5,394,528 | 2/1995 | Kobayashi et al. | 395/325 |

*Primary Examiner*—Rebecca L. Rudolph
*Attorney, Agent, or Firm*—Blakely, Sokoloff, Taylor & Zafman

[57] ABSTRACT

A nonvolatile memory and a method for controlling the nonvolatile memory to switch between first and second data widths are described. The nonvolatile memory includes a first memory array, a second memory array, a first plurality of data pads, and a second plurality of data pads. A data width control circuit selectively couples the first and second plurality of data pads to the first and second memory arrays. A data width configuration cell is provided for configuring data width of the nonvolatile memory. A data width select circuit controls the data width control circuit to selectively couple the first and second plurality of data pads to the first and second memory arrays under the control of the data width configuration cell. When the data width configuration cell is in a first state, the first and second memory arrays are coupled to the first and second plurality of data pads such that the nonvolatile memory has a first data width. When the data width configuration cell is in a second state, the first and second memory arrays are coupled to the first plurality of data pads such that the nonvolatile memory has a second data width.

27 Claims, 7 Drawing Sheets

| TXD8ONLY | BYTE | AM1 | WDBYTE | WDLOBYTE | WDHIBYTE | DATA WIDTH | MEMORY ARRAY |
|---|---|---|---|---|---|---|---|
| 0 | 0 | 0 | 1 | 0 | 1 | BYTE (IN WORD MODE) | LOW BYTE |
| 0 | 0 | 1 | 1 | 1 | 0 | BYTE (IN WORD MODE) | HIGH BYTE |
| 0 | 1 | X | 0 | 0 | 0 | WORD | LOW & HIGH |
| 1 | X | 0 | 1 | 0 | 1 | BYTE ONLY | LOW BYTE |
| 1 | X | 1 | 1 | 1 | 0 | BYTE ONLY | HIGH BYTE |

X = DO NOT CARE

*Figure 7*

NONVOLATILE MEMORY WITH A PROGRAMMABLE OUTPUT OF SELECTABLE WIDTH AND A METHOD FOR CONTROLLING THE NONVOLATILE MEMORY TO SWITCH BETWEEN DIFFERENT OUTPUT WIDTHS

FIELD OF THE INVENTION

The present invention pertains to the field of computer memories. More particularly, this invention relates to a nonvolatile memory that is fully addressable yet has an output that has a selectable width.

BACKGROUND OF THE INVENTION

One type of flash erasable and electrically programmable read-only memory (flash EPROM") is organized into rows and columns. Memory cells are placed at intersections of word lines and bit lines. Each word line is connected to the gates of a plurality of memory cells in one row. Each bit line is connected to the drains of a plurality of memory cells in one column. The sources of all the memory cells are connected to their respective common source lines. The prior flash EPROM can be programmed, and once programmed, the entire contents of the prior flash EPROM can be erased by electrical erasure. A high erasing voltage $V_{PP}$ is made available to the source of all the cells simultaneously. The prior flash EPROM may then be reprogrammed with new data.

The prior flash EPROM typically includes a decoding circuit to address the memory cells. The decoding circuit receives addresses from address input pins of the prior flash EPROM. Data stored in the prior flash EPROM at the applied address can then be mad via data pins of the prior flash EPROM. The prior flash EPROM also typically includes a chip enable pin $\overline{CE}$, an output enable pin $\overline{OE}$, a power down enable pin $\overline{PWD}$, and a write enable pin $\overline{WE}$, which are control function pins.

The prior flash EPROM typically includes a plurality of normal operating modes. Those normal operating modes typically include a mad mode, a programming mode, and an erasure mode. For a read mode, a logical low signal is applied to the chip enable pin $\overline{CE}$ and the output enable pin $\overline{OE}$. Data stored in prior flash EPROM are mad out via the data pins as addressed.

A programming mode allows data to be stored by the prior flash EPROM. To enter the programming mode, a logical high signal is applied to the output enable $\overline{OE}$ pin, a logical low signal is applied to the chip enable $\overline{CE}$ pin, and a $V_{PP}$ high voltage is applied to a $V_{PP}$ pin of the prior flash EPROM. In addition, the programming command is applied to the data pins of the prior flash EPROM prior to the application of the programming data. The write enable signal $\overline{WE}$ is active low. Once in the programming mode, the data applied to the prior flash EPROM is stored in memory cells of the prior flash EPROM at addresses provided from the address input pins.

The prior flash EPROM enters the erasure mode by writing an erasure command into the prior flash EPROM. The write enable signal $\overline{WE}$ is active low and the $V_{PP}$ high voltage is applied to the $V_{PP}$ pin of the prior flash EPROM. Once in the erasure mode, the prior flash EPROM can undergo either an array erasure operation or a block erasure operation.

The prior flash EPROM enters a standby mode by applying a $V_{CC}$ voltage at the chip enable pin $\overline{CE}$. Power consumption of the prior flash EPROM is substantially reduced in the standby mode. When the $\overline{PWD}$ pin of the prior flash EPROM receives a logically active low signal, the prior flash EPROM enters a power down mode in which all circuitry of the prior flash EPROM is powered off. Power consumption of the prior flash EPROM is substantially less than that in the standby mode.

One category of the prior flash EPROM has "byte wide" data pins, which comprise 8 bits. Flash EPROMs with byte wide data pins are typically employed in electronic systems that have a byte wide bus for data transfer.

Another category of the prior flash EPROM has "word wide" data pins, which comprises 16 bits. Flash EPROMs with word wide data pins are typically employed in electronic systems that have a word wide bus for data transfer.

One disadvantage associated with the prior byte wide flash EPROM is that a single byte wide flash EPROM typically cannot be used with a word wide bus. Two byte wide flash EPROMs are typically used to satisfy a word wide bus requirement. The disadvantage of using two byte wide memories instead of one is increased printed circuitry board area which translates to higher cost. Also, increased device count typically reduces overall system reliability.

Another disadvantage associated with the prior word wide flash EPROM is that when a prior word wide flash EPROM is used with a byte wide bus, half of the output pins of the prior flash EPROM are left floating. Moreover, only one-half of the storage capacity of the prior word wide flash EPROM is used with the byte wide bus.

One prior solution is to equip a word wide flash EPROM with a word wide and byte wide mode select pin $\overline{BYTE}$ and a mode select logic. The prior word wide flash EPROM has word wide data pins. When the logical signal applied at the $\overline{BYTE}$ pin causes the prior word wide flash EPROM to be in the word wide mode, all the data pins of the prior word wide flash EPROM couple data and/or commands to and from the prior flash EPROM. When the logical signal applied at the $\overline{BYTE}$ pin causes the prior word wide flash EPROM to be in the byte wide mode, the mode select logic disables the buffer coupled to one half of the data pins such that these data pins do not pass data and commands to and from the prior word wide flash EPROM. In addition, the prior word wide flash EPROM receives an extra address signal via one of the disabled data pins. Thus, the prior word wide flash EPROM can be used in both the word wide environment and the byte wide environment.

Disadvantages are, however, associated with this prior approach. One disadvantage associated is that one half of the data pins of the prior word wide flash EPROM are not used in the byte wide mode, which unnecessarily increases the package size of the prior word wide flash EPROM used in the byte wide mode given the extra pins. It is typically desirable to reduce the number of pins of an integrated circuit in order to reduce package size. This would result in smaller printed circuit board layout. Additionally, the reduced pin count would improve system reliability.

SUMMARY AND OBJECTS OF THE INVENTION

One of the objects of the present invention is to provide a nonvolatile memory that can be used with computer systems of different data widths.

Another object of the present invention is to provide a nonvolatile memory that can be used with systems of different data widths and that does not have unused data pins.

Another object of the present invention is to provide a nonvolatile memory with a programmable output of selectable width.

Another object of the present invention is to provide a nonvolatile memory the data width of which can be determined after fabrication of the memory.

A further object of the present invention is to provide a nonvolatile memory with an output that is selectively programmed word wide or byte wide.

A nonvolatile memory is described that includes a first memory array, a second memory array, a first plurality of data pads, and a second plurality of data pads. A data width control circuit is coupled to (1) the first and second plurality of data pads and (2) the first and second memory arrays for selectively coupling the first and second plurality of data pads to the first and second memory arrays. A data width configuration cell is provided for configuring data width of the nonvolatile memory. The data width configuration cell can be placed in a first state and a second state. When the data width configuration cell is in the first state, the nonvolatile memory is configured to have a first data width. When the data width configuration cell is in the second state, the nonvolatile memory is configured to have a second data width. A data width select circuit is coupled to (1) the data width configuration cell and (2) the data width control circuit for controlling the data width control circuit to selectively couple the first and second plurality of data pads to the first and second memory arrays under the control of the data width configuration cell. When the data width configuration cell is in the first state, the data width select circuit controls the data width control circuit to couple the first and second memory arrays to the first and second plurality of data pads such that the nonvolatile memory has the first data width. When the data width configuration cell is in the second state, the data width select circuit controls the data width control circuit to couple the first and second memory arrays to the first plurality of data pads such that the nonvolatile memory has the second data width.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
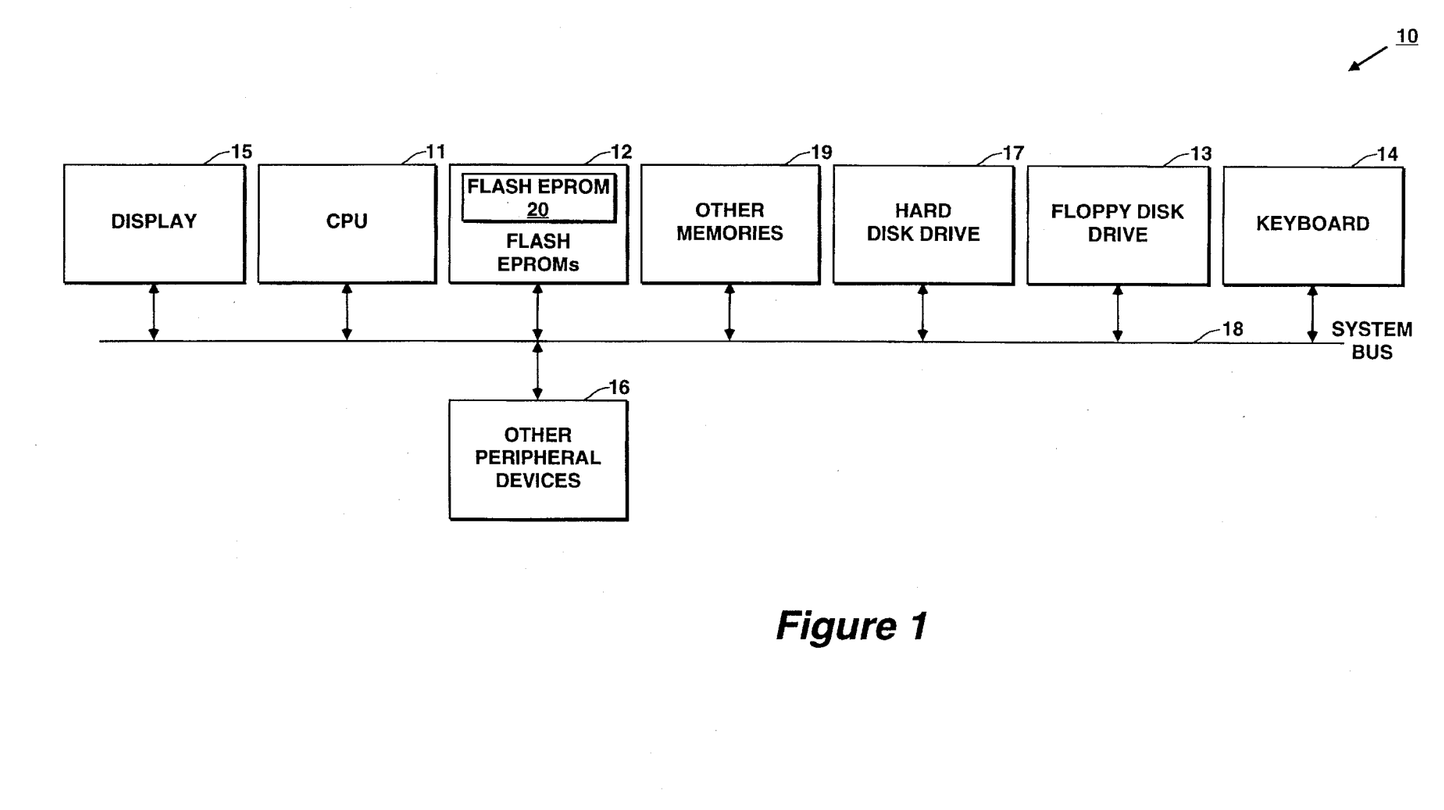
FIG. 1 is a block diagram of a computer system that includes a CPU and flash EPROMs.

FIG. 1 schematically illustrates in block diagram form the architecture of a computer system 10 that includes flash EPROMs 12, each of which implements an embodiment of the present invention.

Figure 2:
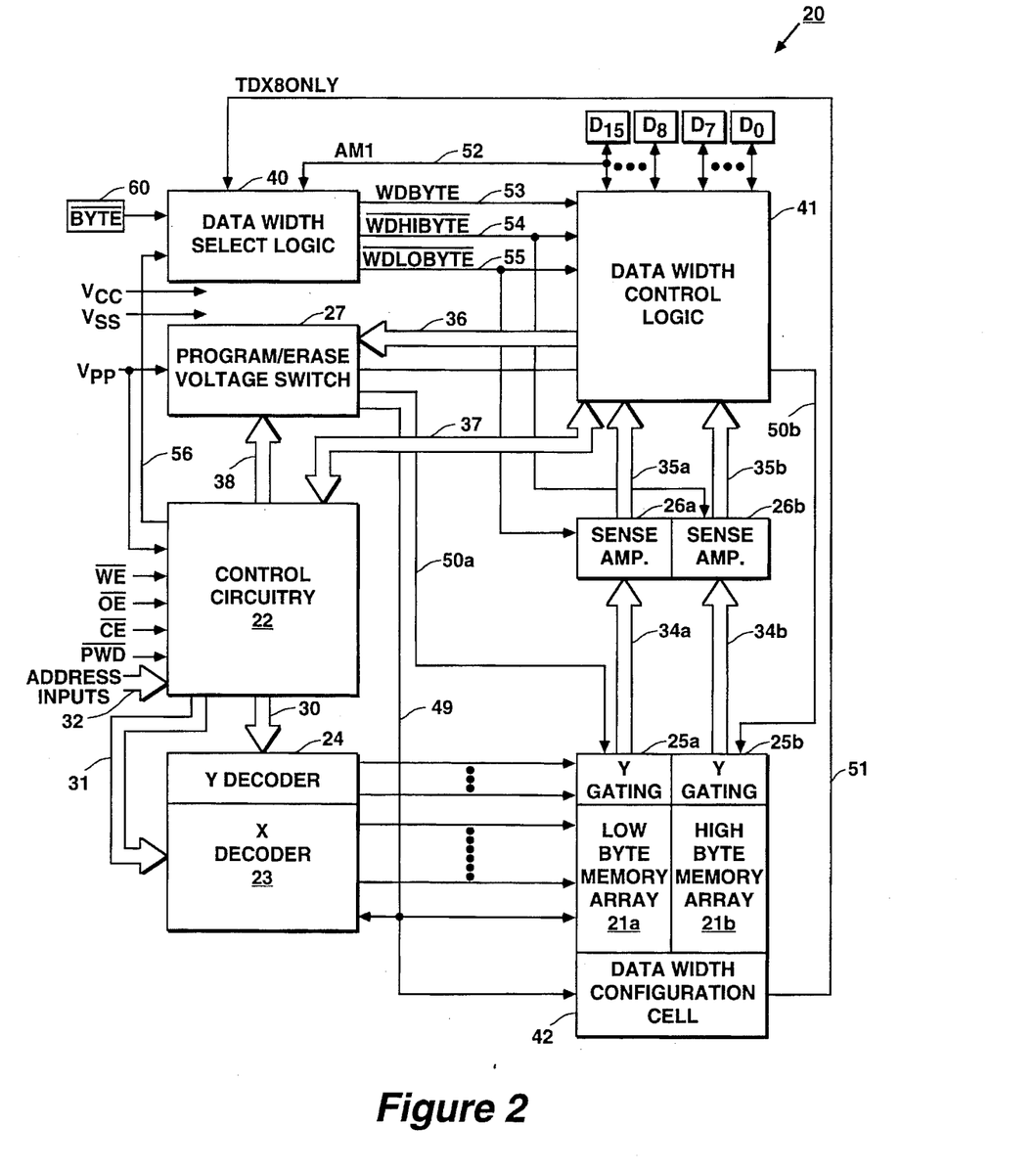
FIG. 2 is a block diagram of a flash EPROM that is used in the computer system of FIG. 1, including a data width configuration cell, a data width select logic, and a data width control logic.

FIG. 2 illustrates in block diagram form the circuitry of flash EPROM 20, which is one of flash EPROMs 12 of FIG. 1. Flash EPROM 20 includes a memory array 21, control circuitry 22 for controlling the operation of memory array 21, and a program/erase voltage switch 23 for applying a program/erase voltage $V_{PP}$ to memory array 21 and control circuitry 22.

As will be described in more detail below, flash EPROM 20 can be programmed to have a first plurality of data pads or a second plurality of data pads.

Referring to FIG. 1, computer system 10 for one embodiment is a personal computer system. For alternative embodiments, computer system 10 comprises a portable computer, a workstation, a minicomputer, a mainframe, or any other type of computer.

Computer system 10 includes a central processing unit ("CPU 11 "). For one embodiment, CPU 11 includes a microprocessor, a coprocessor, a cache, and a cache controller for handling access to the cache by the microprocessor. For one embodiment, CPU 11 comprises an i486™ microprocessor sold by Intel Corporation of Santa Clara, California.

CPU 11 is coupled to a system bus 18 of computer system 10.

Computer system 10 includes flash EPROMs 12. Flash EPROMs 12 are coupled to system bus 18. Flash EPROMs 12 include a plurality of separately packaged flash EPROMs, including flash EPROM 20. Flash EPROMs 12 are accessed by CPU 11 via system bus 18. Flash EPROMs 12 store programs and data for computer system 10.

Computer system 10 also includes other memories 19 that are coupled to system bus 18. Other memories 19 of computer system 10 are accessed by CPU 11 via system bus 18. Other memories 19 may include random access memories ("RAMs"), read only memories ("ROMs"), EPROMs, or other type of memories.

Computer system 10 also includes a floppy disk drive 13, a keyboard 14, a display 15, and a hard disk drive 17 coupled to system bus 18.

Computer system 10 also includes other peripheral devices 16 that are connected to system bus 18. These other peripheral devices include a modem, a serial communication controller, a local area network ("LAN"), and a parallel communication controller.

Referring to FIG. 2, flash EPROM 20 includes a memory array 21, which is made up of memory cells that store data at addresses. As described above, flash EPROM 20 is one of flash EPROMs 12 of FIG. 1. For one embodiment, memory array 21 can store 4 Mbits ("megabits") of data. For another embodiment, memory array 21 can store 8 Mbits of data. For alternative embodiments, memory array 21 can be smaller than 4 Mbits or larger than 8 Mbits.

In one embodiment, memory array 21 is organized into bit line blocks by arranging bit lines into groups. For another embodiment, memory array 21 is organized into word line blocks by arranging word lines into groups.

For one embodiment, all the circuitry of flash EPROM 20 shown in FIG. 2 is on a single substrate. In one embodiment, flash EPROM 20 employs MOS circuitry.

Memory array 21 includes a high byte memory array 21b and a low byte memory array 21a.

Flash EPROM 20 includes sixteen data pads $D_0$ through $D_{15}$ that are coupled to a data width control logic 41. Each of data pads $D_0$–$D_{15}$ can be packaged as a data pin of flash EPROM 20. The function of data pads $D_0$–$D_{15}$, when packaged as data pins, is to couple data to and from memory array 21 and a control circuitry 22 via data width control logic 41. When a data pad is not packaged as a data pin, that data pad does not function to couple data to and from flash EPROM 20. The packaged data pins define the data width of flash EPROM 20.

For alternative embodiments, flash EPROM 20 may include more or less than sixteen data pads.

Data pads $D_0$14 $D_{15}$ receive data from memory array 21 via (1) data width control logic 41, (2) buses 35a and 35b, (3) sense amplifiers 26a and 26b, (4) buses 34a and 34b, and (5) Y gatings 25a and 25b. Data pads $D_0$–$D_{15}$ can also function as inputs to supply data to be programmed in memory array 21 via (1) data width control logic 41, (2) bus 36, (3) a program/erase voltage switch 27, (4) line 50, and (5) Y gatings 25a and 25b and an X decoder 23. Data pads $D_0$–$D_{15}$ can also couple commands to and data from control circuitry 22 via (1) data width control logic 41 and (2) bus 37.

For one embodiment, data pads $D_0$–$D_{15}$ are grouped into low byte data pads $D_0$–$D_7$ and high byte data pads $D_8$–$D_{15}$. For a further embodiment, each of low byte data pads $D_0$–$D_7$ forms a data pad pair with one of high byte data pads $D_0$–$D_{15}$, as shown in FIG. 2.

Due to the provision of data width control logic 41 in flash EPROM 20, when only a portion of data pads $D_0$–$D_{15}$ are packaged as data pins of flash EPROM 20, data can still be supplied to and from entire memory army 21 via the packaged data pins. The portion of memory army 21 that corresponds to the unpackaged portion of data pads $D_0$–$D_{15}$ can receive data from and send data to an external microprocessor (not shown in FIG. 2) via the packaged data pads through data width control logic 41. This allows the data width of flash EPROM 20 to be selectable during packaging without any loss of the storage capacity of flash EPROM 20. For example, when flash EPROM 20 is required to have byte wide data pins (i.e., 8 data pins), only data pads $D_0$–$D_7$ of data pads $D_0$–$D_{15}$ are packaged as data pins, with data $D_{15}$ pad being packaged as an extra address pin. When flash EPROM 20 is required to have word wide data pins (i.e., 16 data pins), all of data pads $D_0$–$D_{15}$ are packaged as data pins. In both cases, memory array 21, however, is fully accessible via the packaged data pins of flash EPROM 20. When flash EPROM 20 is packaged to have the word wide data pins, flash EPROM 20 can still be controlled to have the byte wide data width. This will be described in detail below. The function of data width control logic 41 will be described in more detail below, in conjunction with FIGS. 3–7.

Flash EPROM 20 includes X decoder 23 and a Y decoder 24. X decoder 23 is the row decoder for memory army 21 and Y decoder 24 is the column decoder for memory army 21. X decoder 23 is coupled to the word lines of memory array 21. X decoder 23 receives X addresses from address buses 31 and 32. X decoder 23 selects one word line in accordance with each of the X addresses applied.

Y decoder 24 is coupled to the bit lines of memory array 21 via Y gatings 25a and 25b. Y decoder 24 receives its Y addresses from address buses 30 and 32. In one of read and program operations, Y decoder 24 selects one byte of bit lines (i.e., 8 bit lines) from each of low and high byte memory arrays 21a–21b for each of the Y address applied. Y gating 25a is coupled to sense amplifier 26a and Y gating 25b is coupled to sense amplifier 26b. Sense amplifiers 26a–26b sense the data from the selected bit lines. The data is then applied to data width control logic 41 via buses 35a–35b.

Control circuitry 22 of flash EPROM 20 controls the devices operations with respect to memory array 21. The device operations typically include read, programming, and erasure operations. Control circuitry 22 includes command state control circuitry and write state control circuitry (both are not shown). The write state circuitry of control circuitry 22 regulates the device operations of flash EPROM 20 with only an initiating command from an external microprocessor (not shown). The command is first applied to the command state circuitry of control circuitry 22. The command state circuitry decodes the command and generates the appropriate control signals to the write state circuitry.

Addresses am applied to control circuitry 22 via bus 32. Data and commands are applied to and from control circuitry 22 via (1) bus 37, (2) data width control logic 41, and (3) some of data pads $D_O$–$D_{15}$, which will be described in more detail below.

Flash EPROM 20 also includes a program/erase voltage switch 27. Program/erase voltage switch 27 passes a program voltage $V_{PP}$ onto X decoder 23 via line 49 and a program voltage $V_P$ onto Y gating 25a via line 50a and Y gating 25b via line 50b.

$V_{PP}$ is the program/erase power supply voltage for flash EPROM 20. $V_{PP}$ is coupled to program/erase voltage switch 27 and control circuitry 22. During programming and erasing of flash EPROM 20, program/erase voltage switch 27 passes the $V_{PP}$ and $V_P$ potentials to memory array 21 via X decoder 23 and Y gatings 25a–25b, respectively. In one embodiment, $V_{PP}$ is approximately 12 volts and $V_P$ is approximately 7 volts.

$V_{CC}$ is the device power supply for flash EPROM 20 and $V_{SS}$ is ground. In one embodiment, $V_{CC}$ is approximately 5 volts. In another embodiment, $V_{CC}$ is approximately 3 volts.

Flash EPROM 20 includes three control signals coupled to control circuitry 22 — namely, chip enable $\overline{CE}$, output enable $\overline{OE}$, and write enable $\overline{WE}$. Chip enable input $\overline{CE}$ is the power control and is used for device selection of flash EPROM 20. The output enable input $\overline{OE}$ is the output control for flash EPROM 20 and is used to gate data out from flash EPROM 20, dependent on device selection. When the chip enable $\overline{CE}$ is high at the $V_{CC}$ voltage, flash EPROM 20 enters a standby mode. In the standby mode, power consumption by flash EPROM 20 is reduced.

The write enable signal $\overline{WE}$ allows writes to control circuitry 22 while chip enable input $\overline{CE}$ is active low. Write enable signal $\overline{WE}$ is active low. Addresses and data are latched on the rising edge of the write enable $\overline{WE}$ signal. Standard microprocessor timings are used.

Flash EPROM 20 also includes a $\overline{PWD}$ control signal. The $\overline{PWD}$ control signal is coupled to control circuitry 22. The $\overline{PWD}$ control signal is an active low power down control signal. A logically low $\overline{PWD}$ control signal causes flash EPROM 20 to enter the power down mode. When flash EPROM 20 enters the power down mode, all circuits of flash EPROM 20 are powered off. When the $\overline{\text{PWD}}$ control signal raises to the $V_{CC}$ voltage (i.e., logical high), flash EPROM 20 returns to its normal operation modes.

For alternative embodiments, flash EPROM 20 functions without some of the above-mentioned control signals.

As described above, flash EPROM 20 can be packaged with different data pins. For one embodiment, flash EPROM 20 can be packaged to have word wide data pins or byte wide data pins. In order to accomplish this, either all of data pads $D_0$–$D_{15}$ or only the low byte data pads $D_0$–$D_7$ are packaged as data pins of flash EPROM 20. When flash EPROM 20 is packaged into a byte wide flash EPROM, data pads $D_0$–$D_7$ are packaged as data pins to supply data to and from flash EPROM 20. In this case, one of data pads $D_8$–$D_{15}$ is packaged as an extra address pin. For one embodiment, data pad $D_{15}$ is packaged as the extra address pin. When flash EPROM 20 is packaged into a word wide flash EPROM, data pads $D_0$–$D_{15}$ are packaged as data pins to supply data to and from flash EPROM 20.

When flash EPROM 20 is packaged to have the word wide data pins, flash EPROM 20 can still be controlled to select between the word wide data width and the byte wide data width. When flash EPROM 20 is selected to have the byte wide data width, packaged data pads $D_8$–$D_{15}$ am not used as data pins of flash EPROM 20 and do not supply data to and from flash EPROM 20.

Flash EPROM 20 also includes a data width configuration cell 42. Data width configuration cell 42 is located peripherally to memory army 21. Data width configuration cell 42 is a flash EPROM-type cell that can be electrically programmed and erased. Configuration cell 42 is used in flash EPROM 20 to configure the data pins of flash EPROM 20. For example, when configuration cell 42 is in a programmed state, flash EPROM 20 is packaged into a word wide flash EPROM in which all data pads $D_0$–$D_{15}$ are packaged as data pins. When configuration cell 42 is in an erased state, flash EPROM 20 is packaged into a byte wide flash EPROM in which only data pads $D_0$–$D_7$ am packaged as data pins. The function of configuration cell 42 will be described in detail below.

Flash EPROM 20 also includes a data width select logic 40 that is coupled to (1) configuration cell 42, (2) data width control logic 41, (3) sense amplifiers 26a–26b, (4) data pad $D_{15}$, and (5) control circuit 22. Data width select logic 40 receives a TDX8ONLY signal from configuration cell 42 via line 51 and an AM1 signal from data pad $D_{15}$ via line 52. Data width select logic 40 also receives control signals from control circuitry 22 via line 56. Data width select logic 40 controls data width control logic 41 to selectively couple memory arrays 21a and 21b to data pads $D_0$–$D_{15}$ under the control of the TDX8ONLY signal. For example, when the TDX8ONLY signal is a logical high signal (i.e., configuration cell 42 is in the erased state), data pads $D_0$–$D_7$ are packaged and data width select logic 40 causes data width control logic 41 to selectively couple memory arrays 21a–21b to packaged data pads $D_0$–$D_7$. When the TDX8ONLY signal is a logical low signal (i.e., configuration cell 42 is in the programmed state), data pads $D_0$–$D_{15}$ are packaged and data width select logic 40 causes data width control logic 41 to couple memory arrays 21a–21b to packaged data pads $D_0$–$D_{15}$.

Flash EPROM 20 also includes a data width selection pad $\overline{\text{BYTE}}$ 60. $\overline{\text{BYTE}}$ pad 60 can be packaged as a data width selection pin. When data pads $D_0$–$D_7$ are packaged as data pins, $\overline{\text{BYTE}}$ pad 60 is not packaged as the data width selection pin. When data pads $D_0$–$D_{15}$ are packaged as data pins, $\overline{\text{BYTE}}$ pad 60 is packaged as the data width selection pin to further control the selection of data width of flash EPROM 20. $\overline{\text{BYTE}}$ pad 60 is coupled to data width select logic 40. When packaged $\overline{\text{BYTE}}$ pad 60 receives a logical low signal, flash EPROM 20 only has packaged data pad $D_0$–$D_7$ as its data pins and data width select logic 40 causes data width control logic 41 to couple one of memory arrays 21a–21b to data pads $D_0$–D7. Which one of memory arrays 21a–21b is coupled to data pads $D_0$–$D_7$ depends on the AM1 signal received from data pad $D_{15}$. When packaged $\overline{\text{BYTE}}$ pad 60 receives a logical high signal, flash EPROM 20 has packaged data pads $D_0$–$D_{15}$ as its data pins and data width select logic 40 causes data width control logic 41 to couple memory arrays 21a–21b to data pads $D_0$–$D_{15}$.

Data width select logic 40 generates a WDBYTE control signal to data width control logic 41 via line 53. The WDBYTE signal is a data width control signal. When the WDBYTE signal is logically high, data is only coupled to and from memory array 21 via data pads $D_0$–$D_7$. When the WDBYTE signal is logically low, data is coupled to and from memory array 21 via data pads $D_0$–$D_{15}$.

Data width control logic 40 also generates a $\overline{\text{WDLOBYTE}}$ control signal and a $\overline{\text{WDHIBYTE}}$ control signal to data width control logic 41 via lines 54 and 55. The $\overline{\text{WDLOBYTE}}$ signal is applied to sense amplifier 26a via line 55 and the $\overline{\text{WDHIBYTE}}$ signal is applied to sense amplifier 26b via line 54. The $\overline{\text{WDHIBYTE}}$ and the $\overline{\text{WDLOBYTE}}$ signals are used when data is coupled to and from memory array 21 via packaged data pads $D_0$–$D_7$ only. The $\overline{\text{WDLOBYTE}}$ signal is used to control data width control logic 41 to couple low byte memory array 21a. The $\overline{\text{WDHIBYTE}}$ signal is used to control data width control logic 41 to couple high byte memory array 21b.

When packaged $\overline{\text{BYTE}}$ pad 60 receives a logical low signal when the TDX8ONLY signal is logically low, data width select logic 40 generates a logical high WDBYTE signal that causes data width control logic 41 to couple memory array 21 to packaged low byte data pads $D_0$–$D_7$. At this moment, data width select logic 40 receives the AM1 signal from data pad $D_{15}$ via line 52 as data pad $D_{15}$ is disconnected from memory array 21 by data width control logic 41. Depending on the value of the AM1 signal, data width select logic 40 activates the $\overline{\text{WDLOBYTE}}$ signal or the $\overline{\text{WDHIBYTE}}$ signal to data width control logic 41 to couple low byte memory array 21a or high byte memory array 21b to be connected to packaged data pads $D_0$–$D_7$.

Figure 7:
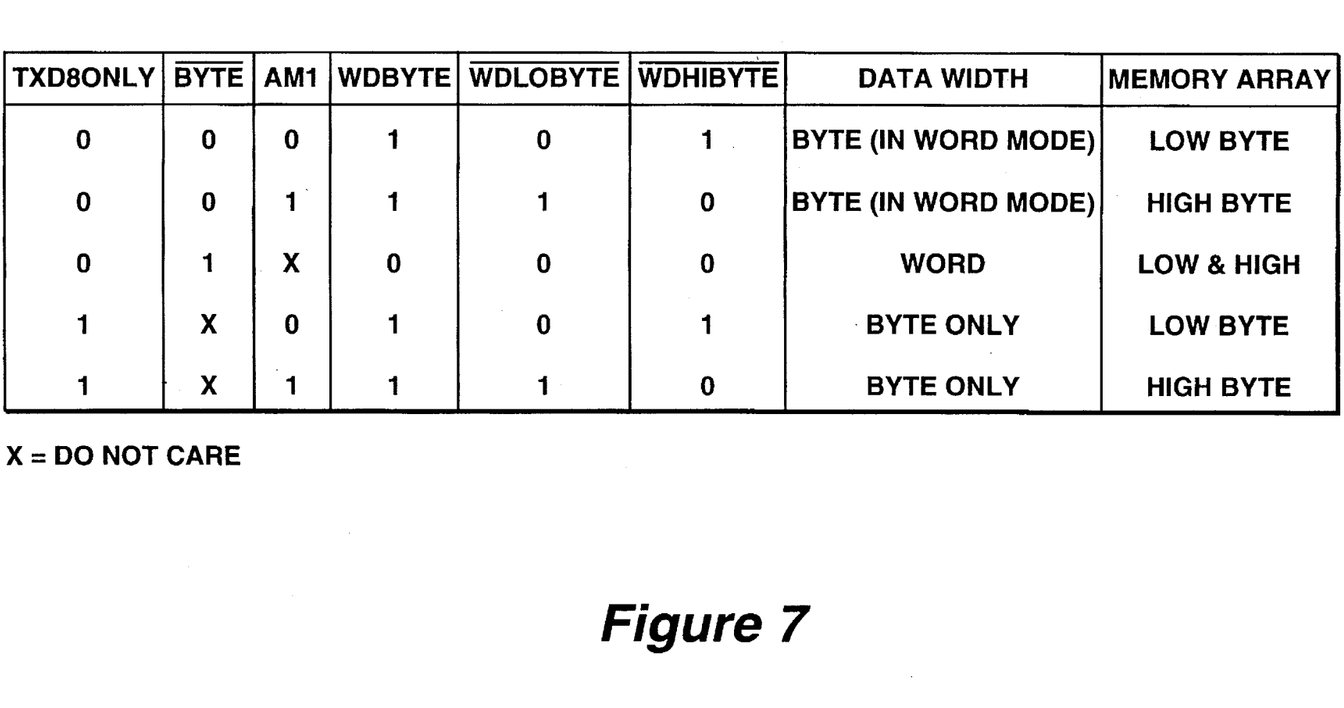
FIG. 7 is a logic table showing the relation of the TDX8ONLY, $\overline{\text{BYTE}}$, AM1, WDBYTE, $\overline{\text{WDLOBYTE}}$, and $\overline{\text{WDHIBYTE}}$ signals illustrated in FIGS. 2–6.

When $\overline{\text{BYTE}}$ pad 60 receives a logical high signal when the TDX8ONLY signal is logically low, data width select logic 40 generates a logical low WDBYTE signal to data width control logic 41 to couple memory arrays 21a–21b to data pads $D_0$–$D_7$. At this moment, data width select logic 40 does not receive the AM1 signal from data pad $D_{15}$. Data width select logic 40 also activates both the $\overline{\text{WDHIBYTE}}$ signal and the $\overline{\text{WDLOBYTE}}$ signal. Memory array 21a is coupled by control logic 41 to data pads $D_0$–$D_7$ and memory array 21b is coupled to data pads $D_8$–$D_{15}$ by control logic 41. The relation of the TDX8ONLY signal, the AM1 signal, the $\overline{\text{BYTE}}$ signal, the WDBYTE signal, the $\overline{\text{WDLOBYTE}}$ signal, and the $\overline{\text{WDHIBYTE}}$ signal is illustrated in FIG. 7, which will be described in detail below.

The data pins of flash EPROM 20 are determined after flash EPROM 20 is manufactured but before it is packaged. When flash EPROM is determined to have word wide data pins which means that data pads $D_0$–$D_{15}$ are packaged as data pins, configuration cell 42 is programmed into the programmed state and the TDX8ONLY signal is a logical low signal. $\overline{BYTE}$ selection signal $\overline{BYTE}$. As described above, although data pads $D_0$–$D_{15}$ have all been packaged as data pins, flash EPROM 20 can still select between the byte wide data width and the word wide data width. This is controlled by the $\overline{BYTE}$ signal. The logical low TDX8ONLY signal causes data width select logic 40 to receive the $\overline{BYTE}$ signal. When the $\overline{BYTE}$ signal is at logical high level, which indicates the flash EPROM 20 has the word wide data width, data width select logic 40 applies WDBYTE signal (FIG. 7) to data width control logic 41. In addition, data width select logic 40 applies a logical low $\overline{WDLOBYTE}$ signal and a logical low $\overline{WDHIBYTE}$ signal (FIG. 7) to data width control logic 41. Under the control of these signals, data width control logic 41 couples low byte memory array 21a to packaged low byte data pads $D_0$–$D_7$ and high byte memory array 21b to packaged high byte data pads $D_8$–$D_{15}$. Flash EPROM 20, therefore, has the word wide data width.

When the $\overline{BYTE}$ signal is at logical low level, data width select logic 0 applies a logical high $\overline{WDBYTE}$ signal (FIG. 7) to data width control logic 41. Data width control logical 41 then disconnects memory array 21b with packaged data pads $D_8$–$D_{15}$ and selectively couples memory arrays 21a–21b to packaged data pads $D_0$–$D_7$.

At this moment, packaged data pad $D_{15}$ receives the extra address signal AM1. The AM1 signal is applied to data width select logic 40. Based on the logical value of the AM1 signal, select logical 40 activates one of the $\overline{WDLOBYTE}$ and $\overline{WDHIBYTE}$ signals (FIG. 7) to control logic 41 to couple the respective one of memory arrays 21a–21b to data pads $D_0$–$D_7$. For example, when the AM1 signal is a logical low signal, data width select logic 40 causes the $\overline{WDLOBYTE}$ signal to be logically low while the $\overline{WDHIYTE}$ signal remains logically high (FIG. 7). This causes control logic 41 to couple low byte memory array 21a to packaged data pads $D_0$–$D_7$. The logical high $\overline{WDHIBYTE}$ signal is also applied to sense amplifier 26b to disable sense amplifier 26b.

When the AM1 signal is a logical high signal, data width select logic 40 causes the $\overline{WDHIBYTE}$ signal to be logically low while the $\overline{WDLOBYTE}$ signal to be logically high (FIG. 7). This thus causes control logic 41 to couple high byte memory array 21b to packaged data pad $D_0$–$D_7$. The logical high $\overline{WDLOBYTE}$ signal is also applied to sense amplifier 26a to disable sense amplifier 26a.

When flash EPROM 20 is determined to have byte wide data pins which means that only data pads $D_0$–$D_7$ are packaged as data pins, configuration cell 42 is programmed into the erased state and the TDX8ONLY signal is at logical high level. $\overline{BYTE}$ pad 60 is not packaged as the $\overline{BYTE}$ pin. The logical high TDX8ONLY signal then causes data width select logic 40 to disable its input from $\overline{BYTE}$ pad 60 and applies a logical high WDBYTE signal (FIG. 7) to data width control logic 41 to allow control logic 41 to selectively couple one of low and high byte memory arrays 21a and 21b to packaged data pads $D_0$–$D_7$. Which one of memory arrays 21a–21b is to be coupled to data pads $D_0$–$D_7$ now depends on the AM1 signal from data pad $D_{15}$ that has been packaged as the extra address pin.

When the AM1 signal is logically low, data width select logic 40 applies a logical low $\overline{WDLOBYTE}$ signal and a logical high $\overline{WDHIBYTE}$ signal (FIG. 7) to control logic 41. Control logic 41 then couples memory array 21a to packaged data pads $D_0$–$D_7$. The logical high $\overline{WDHIBYTE}$ signal is also applied to sense amplifier 26b to disable it.

When the AM1 signal is logically high, data width select logic 40 applies a logical low $\overline{WDHIBYTE}$ signal and a logical high $\overline{WDLOBYTE}$ signal (FIG. 7) to control logic 41. Control logic 41 then couples memory array 21b to packaged data pads $D_0$–$D_7$. The logical high $\overline{WDLOBYTE}$ signal is also applied to sense amplifier 26a to disable it.

Data width control logic 41 controls the coupling of one of memory arrays 21a–21b to packaged data pads $D_0$–$D_7$ in both read and programming operation of flash EPROM 20 when only data pads $D_0$–$D_7$ are packaged as data pins or when only packaged data pads $D_0$–$D_7$ of packaged data pad $D_0$–$D_{15}$ are employed to supply data to and from memory array 21. During programming operation, when only packaged data pads $D_0$–$D_7$ are used as data pins, data width control logic 41 receives the data to be programmed from packaged data pads $D_0$–$D_7$ and stores the data in its data latch associated with the respective one of memory arrays 21a–21b. For example, when packaged data pads $D_0$–$D_7$ receive a data to be programmed in memory array 21a, data width control logic 41 stores the data in its data latch associated with memory array 21a. The data latch in control logic 41 then couples the data it stores to program/erase voltage switch 27 via bus 36. Switch 27 then applies the program voltage $V_P$ to Y gating 25a via line 50a to program the memory cells along the selected bit lines in memory array 21a. The structure and operation of data width control logic 41 will be described in detail below, in conjunction with FIGS. 3 and 7.

Figure 3:
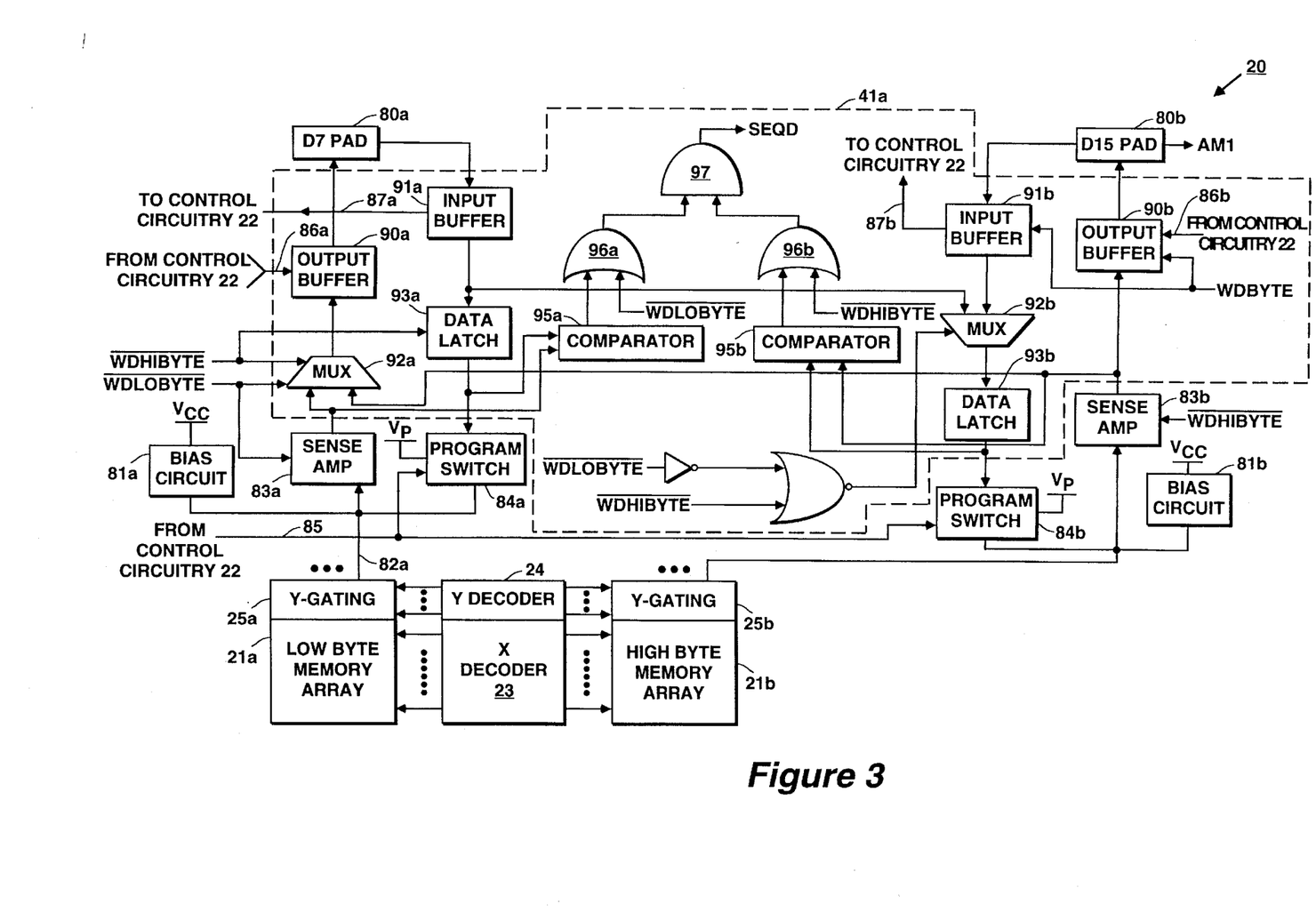
FIG. 3 is another block diagram of the flash EPROM illustrating the data width control logic.

FIG. 3 illustrates data width control logic 41 of flash EPROM 20 in more detail. In FIG. 3, for illustration purposes only data width control logic 41a of data width control logic 41 that couples data pads $D_7$ and $D_{15}$ to low and high byte memory arrays 21a–21b is shown. The control logic of data width control logic 41 for each pair of data pads $D_0$ and $D_8$, $D_1$ and $D_9$, $D_2$ and $D_{10}$, $D_3$ and $D_{11}$, $D_4$ and $D_{12}$, $D_5$ and $D_{13}$, and $D_6$ and $D_{14}$ has the logic configuration analogous to that of logic 41 a shown in FIG. 3.

As can be seen from FIG. 3, connection line 82a is coupled to a sense amplifier 83a and a program switch 84a. In addition, connection line 82a is coupled to a bias circuit 81a for biasing connection line 82a. Sense amplifier 83a is one of eight sense amplifiers of sense amplifier 26a of FIG. 2 and program switch 84a is one of eight low byte memory array program switches of program/erase voltage switch 27. Similarly, connection line 82b is coupled to a sense amplifier 83b, a program switch 84b, and a bias circuit 81b for biasing connection line 82b. Sense amplifier 83b is one of eight sense amplifiers of sense amplifier 26b of FIG. 2 and program switch 84b is one of eight high byte memory array program switches of program/erase voltage switch 27.

The output of sense amplifier 83a is applied to a multiplexer 92a and a comparator 95a. The other input of multiplexer 92a is the output of sense amplifier 83b. The output of multiplexer 92a is applied to data pad $D_7$ 80a via an output buffer 90a.

Program switch 84a receives the data to be programmed in memory array 21a from input buffer 91a via data latch 93a. Input buffer 91a is coupled to $D_7$ pad 80a for receiving the data to be programmed. Data latch 93a also applies the data to comparator 95a. The function of comparator 95a is to compare the data to be programmed with the data sensed from the memory cell being programmed to verify if the data has been written into the selected memory cell. Program switch 84a is also coupled to control circuitry 22 (FIG. 2) via line 85 for receiving control signals from control circuitry 22 for programming. The output of comparator 95a is applied to an OR gate 96a.

The output of input buffer 91a is also applied to control circuitry 22. When a command is applied to flash EPROM 20, $D_7$ pad 80a receives one bit of the command and couples the bit to input buffer 91a. Input buffer 91a then supplies the bit to control circuitry 22 via line 87a. Output buffer 90a also receives an input from control circuitry 22 of FIG. 2. When a data from a status register of control circuitry 22 of FIG. 2 is read out of flash EPROM 20, output buffer 90a receives one bit of the data from control circuitry 22 via line 86b and couples the bit to $D_7$ pad 80a.

The output of sense amplifier 83b is also applied to output buffer 90b and a comparator 95b. Output buffer 90b is coupled to data pad $D_{15}$ 80b. Output buffer 90b also receives an input from control circuitry 22.

Program switch 84b receives the data to be programmed in memory array 21b from data latch 93b. Program switching 84b is also coupled to control circuitry 22 (FIG. 2) via line 85. The output of data latch 93b is also applied to comparator 95b. The function of comparator 95b, like comparator 95a, is to determine whether the data is programmed into the selected cell. The output of comparator 95b is applied to an OR gate 96b. The outputs of OR gates 96a and 96b are applied to an AND gate 97. AND gate 97 outputs an SEQD signal. The SEQD signal is applied to control circuitry 22 of FIG. 2. The SEQD signal indicates whether the data to be programmed is actually written into the selected memory cell, and if so, controls control circuitry 22 to cause the respective one of program switches 84a–84b to stop applying the $V_P$ potential.

Data latch 93b receives its input from a multiplexer 92b. One of the inputs of multiplexer 92b is from input buffer 91a that is connected to $D_7$ pad 80a. The other input of multiplexer 92b is from an input buffer 91b that is connected to $D_{15}$ pad 80b. The output of input buffer 91b is also applied to control circuitry 22. $D_{15}$ pad 80b also outputs the AM1 signal to data width select logic 40 of FIG. 2.

Input buffer 91b does not couple the command information to control circuitry 22. When a command is applied to flash EPROM 20 in which all data pads $D_0$–$D_{15}$ are packaged as data pins, only data pads $D_0$–$D_7$ receive the command.

When flash EPROM 20 has the byte wide data width, both input buffer 91b and output buffer 90b do not couple data to or from control circuitry 22. This is because the status data and commands are all byte wide.

Multiplexer 92a receives the $\overline{\text{WDHIBYTE}}$ and $\overline{\text{WDLOBYTE}}$ control signals. These two control signals control multiplexer 92a to select one of sense amplifiers 83a and 83b to couple to output buffer 90a during read operation of flash EPROM 20. The $\overline{\text{WDLOBYTE}}$ signal is also applied to sense amplifier 83a to disable it when multiplexer 92a does not apply the output of sense amplifier 83a to output buffer 90a. The $\overline{\text{WDLOBYTE}}$ signal is also applied to OR gate 96a to control OR gate 96a to apply the output of comparator 95a to AND gate 97. The $\overline{\text{WDHIBYTE}}$ signal is also applied to data latch 93a to control data latch 93a to receive the data to be programmed from input buffer 91a. For example, when the data in input buffer 91a is to be programmed in low byte memory array 21a, the $\overline{\text{WDHIBYTE}}$ signal causes data latch 93a to receive the data from input buffer 91a. When the data in input buffer 91a is not to be programmed in memory array 21a, the $\overline{\text{WDHIBYTE}}$ signal causes data latch 93a not to latch in the data.

Multiplexer 92b receives the $\overline{\text{WDLOBYTE}}$ and $\overline{\text{WDHIBYTE}}$ signals via a NOR gate 98 and an inverter 99.

These two control signals control multiplexer 92b to select one of input buffers 91a and 91b to be coupled to data latch 93b during programming operation of flash EPROM 20. The $\overline{\text{WDHIBYTE}}$ signal is also coupled to OR gate 96b to control OR gate 96b to apply the output of comparator 95b to AND gate 97. The $\overline{\text{WDHIBYTE}}$ signal is also applied to sense amplifier 83b to disable sense amplifier 83b when multiplexer 92a does not apply the output of sense amplifier 83b to output buffer 90a.

Both output buffer 90b and input buffer 91b receive the WDBYTE signal. When $D_{15}$ pad 80b does not function as a data pin to couple data to and from memory array 21b, the WDBYTE signal disables both input buffer 91b and output buffer 90b such that $D_{15}$ pad 80b can function as an extra address pin to supply the AM1 signal to data width select logic 40 of FIG. 2.

Referring to FIGS. 3 and 7, when flash EPROM 20 has the word wide data width and word wide data pins, the TDX8ONLY signal is at logical low level and the $\overline{\text{BYTE}}$ signal is logically high. This causes the WDBYTE, $\overline{\text{WDLOBYTE}}$ and $\overline{\text{WDHIBYTE}}$ signals to be logically low. The logically inactive low WDBYTE signal allows output buffer 90b and input buffer 91b to receive data from sense amplifier 83b and $D_{15}$ pad 80b, respectively. The $\overline{\text{WDLOBYTE}}$ and $\overline{\text{WDHIBYTE}}$ signals cause (1) multiplexer 92a to couple the output of sense amplifier 83a to output buffer 90a and (2) multiplexer 92b to couple input buffer 91b to data latch 93b.

When flash EPROM 20 is in the read operation, these control signals allows (1) the output of sense amplifier 83a to be coupled to $D_7$ pad 80a via multiplexer 92a and output buffer 90a and (2) the output of sense amplifier 83b to be coupled to $D_{15}$ pad 80b via output buffer 90b.

When flash EPROM 20 is in the programming operation, program switch 84a receives its data from $D_7$ pad 80a via input buffer 91a and data latch 93a. Program switch 84b receives its data from $D_{15}$ pad 80b via input buffer 91b, multiplexer 92b, and data latch 93b.

The logical low $\overline{\text{WDHIBYTE}}$ and $\overline{\text{WDLOBYTE}}$ signals also allows OR gate 96a–96b to apply the outputs of comparators 95a and 95b to AND gate 97.

When the TDX8ONLY signal and the $\overline{\text{BYTE}}$ signal are both logically low, data width select logic 40 (FIG. 2) causes the WDBYTE signal to be logically high. The logical high WDBYTE signal disables output buffer 90b and input buffer 91b. In this situation, flash EPROM 20 has the byte wide data width and memory array 21b can supply and receive data only through data pads $D_0$–$D_7$. Which one of memory arrays 21a–21b is coupled to data pads $D_0$–$D_7$ now depends on the AM1 signal received at $D_{15}$ pad 80b. When the AM1 signal is logically low, data width select logic 40 causes the $\overline{\text{WDLOBYTE}}$ signal to be logically low and the $\overline{\text{WDHIBYTE}}$ signal to be logically high. The logic low $\overline{\text{WDLOBYTE}}$ signal causes multiplexer 92a to couple the output of sense amplifier 83a to $D_7$ pad 80a via output buffer 90a. The logical high $\overline{\text{WDHIBYTE}}$ signal causes multiplexer 92b not to couple the output of input buffer 91a to data latch 93b. The logical high $\overline{\text{WDHIBYTE}}$ signal also disables sense amplifier 83b. At this time, memory array 21a is selected to couple to $D_7$ pad 80a.

When the AM1 signal is logically high, data width select logic 40 causes the $\overline{\text{WDHIBYTE}}$ signal to be logically low and the $\overline{\text{WDLOBYTE}}$ signal to be logically high. The logical low $\overline{\text{WDHIBYTE}}$ signal causes multiplexer 92a to couple the output of sense amplifier 83b to $D_7$ pad 80a via output buffer. The $\overline{\text{WDHIBYTE}}$ and $\overline{\text{WDLOBYTE}}$ signals also cause multiplexer 92b to couple the output of input buffer 91a to data latch 93b. The logical high $\overline{\text{WDLOBYTE}}$ signal also disables sense amplifier 83a. At this time, memory array 21b is selected to couple to data pads $D_0$–$D_7$.

When flash EPROM 20 has the byte wide data pins, the TDX8ONLY signal is logically high. The logical high TDX8ONLY signal blocks data width select logic 40 to receive the $\overline{\text{BYTE}}$ signal.

As can be seen from FIG. 7, the logical high TDX8ONLY signal causes data width select logic 40 (FIG. 2) to output a logical high WDBYTE signal. The logical high WDBYTE signal disables output buffer 90b and input buffer 91b such that memory array 21b will not be coupled to $D_{15}$ pad 80b. In this situation, flash EPROM 20 has the byte wide data pins and memory array 21b can supply and receive data only through $D_7$ pad 80a. Which one of memory arrays 21a–21b is coupled to $D_7$ pad 80a now depends on the AM1 signal at $D_{15}$ pad 80b. The operation is similar to what has been described above.

Figure 4:
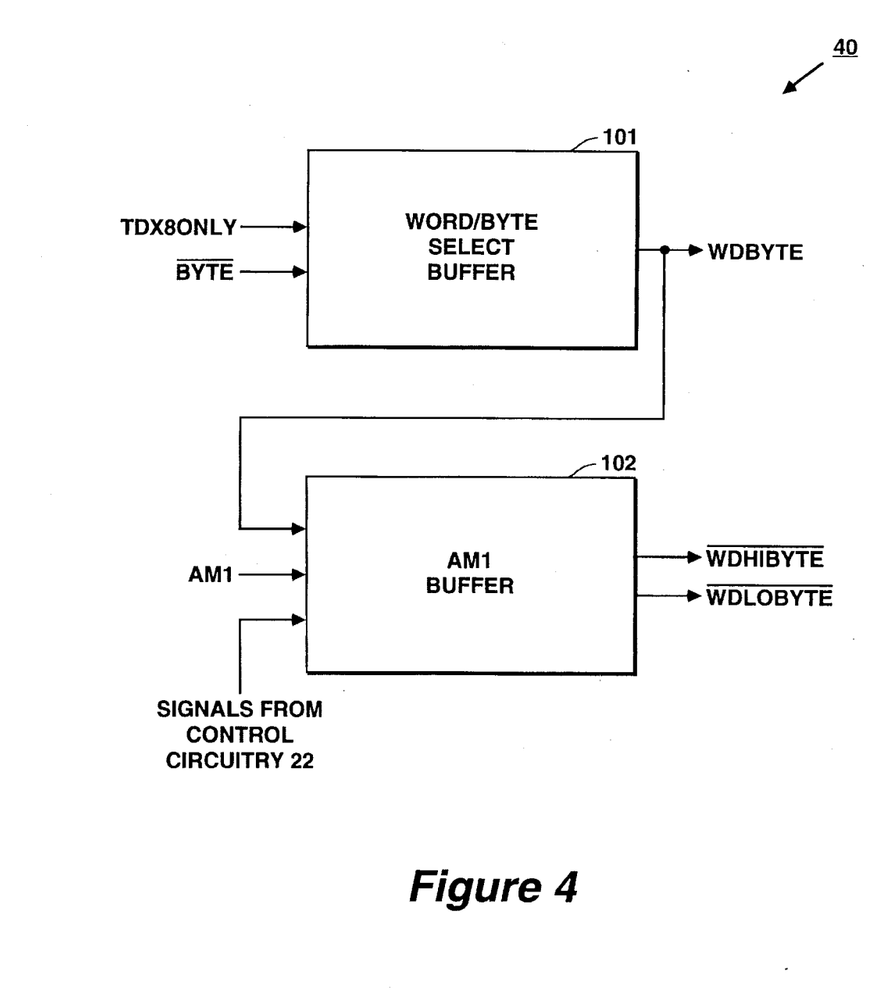
FIG. 4 is a block diagram of the data width select logic, including a word/byte select buffer and an AM1 address buffer.
Figure 5:
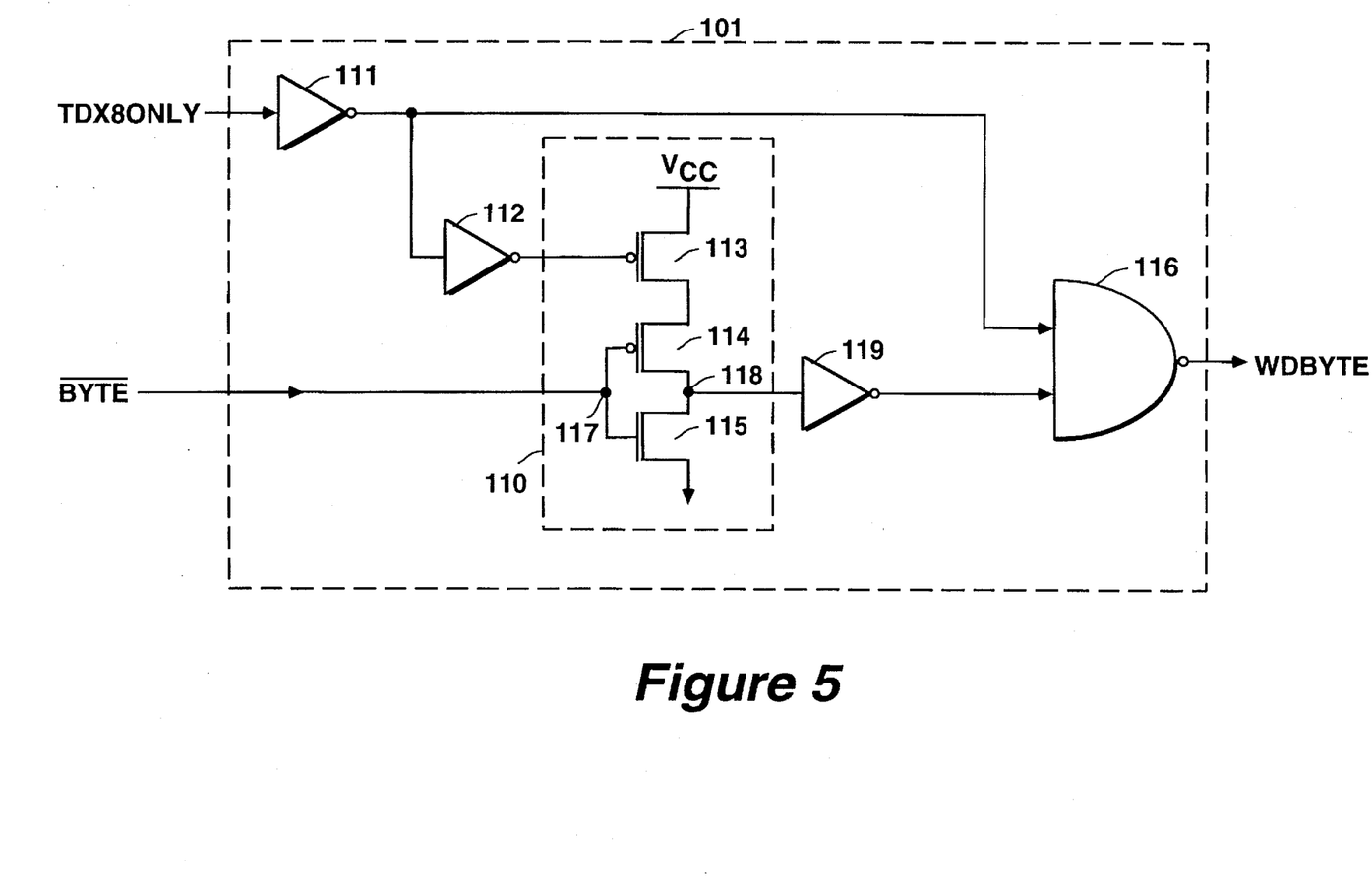
FIG. 5 illustrates circuitry of the word/byte select buffer of FIG. 4.

FIG. 4 illustrates in block diagram from data width select logic 40. In FIG. 4, data width select logic 40 includes a word/byte select buffer 101 and an AM1 buffer 102. Word/byte select buffer 101 receives the TDX8ONLY signal and the $\overline{\text{BYTE}}$ signal. Word/byte select buffer 101 generates the WDBYTE signal. FIG. 5 illustrates the circuitry of word/byte select buffer 101, which will be described in detail below.

AM1 buffer 102 receives the AM1 signal and the $\overline{\text{WDBYTE}}$ signal. In addition, AM1 buffer 102 receives signals from control circuitry 22. AM1 buffer 102 generates the $\overline{\text{WDHIBYTE}}$ signal and the $\overline{\text{WDLOBYTE}}$ signal. The circuitry of AM1 buffer 102 is described in detail below, in conjunction with FIG. 6.

Referring to FIG. 5, the TDX8ONLY signal is coupled to an NAND gate 116 via an inverter 111. NAND gate 116 outputs the WDBYTE signal when the TDX8ONLY signal is logically high, NAND gate 116 is blocked to output a logical high WDBYTE signal. When the TDX8ONLY signal is logically low, the value of the WDBYTE signal depends on the $\overline{\text{BYTE}}$ signal.

The $\overline{\text{BYTE}}$ signal is applied to a circuit 110. Circuit 1101 also receives the TDX8ONLY signal via inverters 111 and 112. Circuit 110 functions to convert the voltage level of the $\overline{\text{BYTE}}$ signal from TTL voltage level to CMOS voltage level. Moreover, circuit 110 functions as an inverter for the $\overline{\text{BYTE}}$ signal when the TDX8ONLY signal is logically low. The output of circuit 110 is coupled to NAND gate 116 via an inverter 119.

As described above, when the TDX8ONLY signal is logically low, the WDBYTE signal depends on the $\overline{\text{BYTE}}$ signal. When the $\overline{\text{BYTE}}$ signal is logically high, the WDBYTE signal is a logical low signal. When the $\overline{\text{BYTE}}$ signal is logically low, the WDBYTE signal is a logical high signal.

Figure 6:
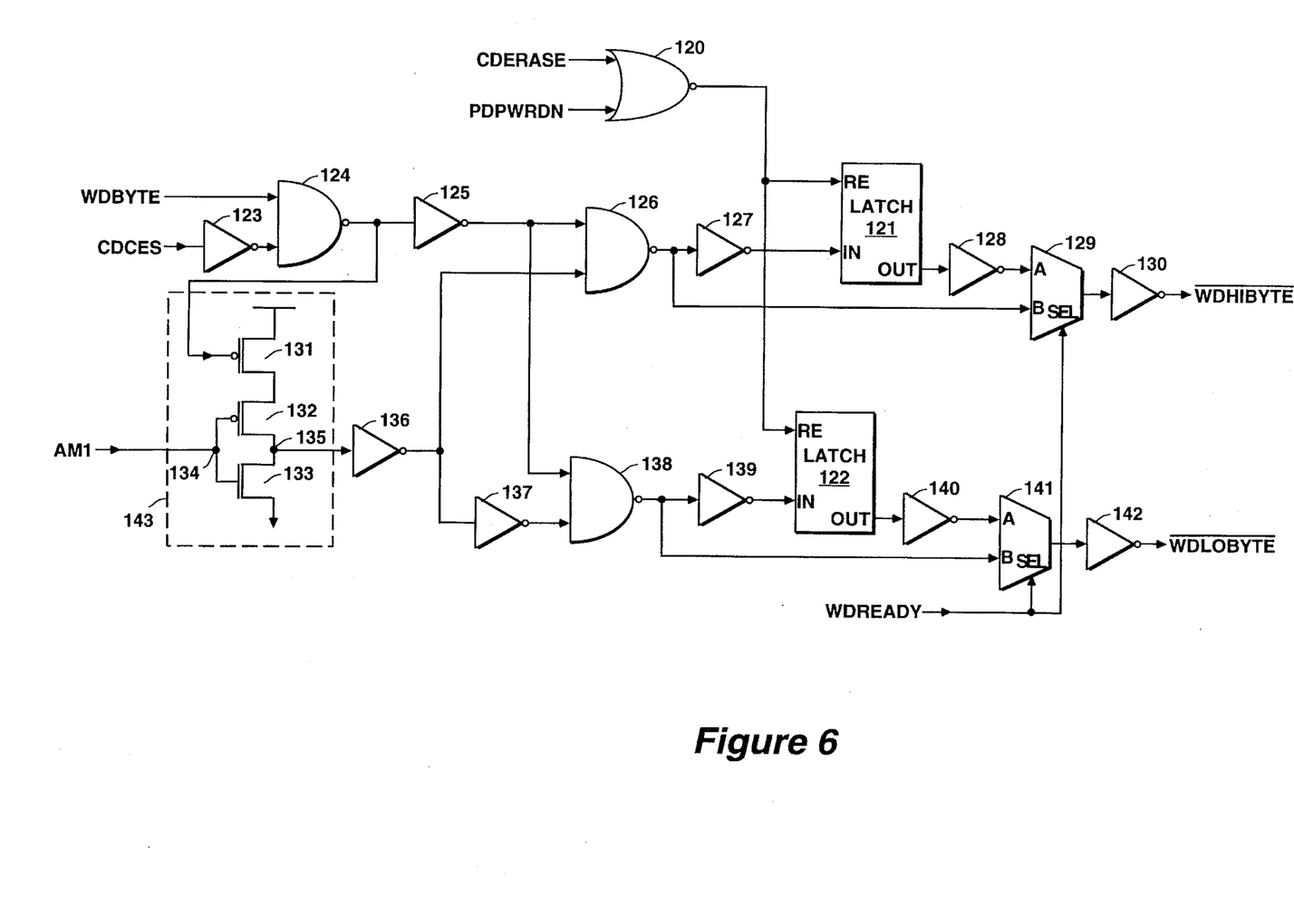
FIG. 6 illustrates circuitry of the AM1 address buffer of FIG. 4.

Referring to FIG. 6, the circuit of AM1 buffer 102 is shown. AM1 buffer 102 includes a circuit 143 for receiving the AM1 signal. The function of circuit 143 is to convert the voltage level of the AM1 signal from TTL voltage level to CMOS voltage level. AM1 buffer 102 also includes latches 121 and 122 and multiplexers 129 and 141.

As can be seen from FIG. 6, AM1 buffer 102 receives a PDPWRDN signal, a CDERASE signal, a CDCES signal, and a WDREADY signal. These signals are from control circuitry 22 of flash EPROM 20. The PDPWRDN signal is a power down signal. The CDERASE signal indicates that flash EPROM 20 is in the erasure operation. The CDCES signal is derived from the $\overline{\text{CE}}$ signal that blocks AM1 buffer 102 when active. The WDREADY signal is used to control multiplexer 129 to couple the output of latch 121 to become the $\overline{\text{WDHIBYTE}}$ signal during programming and erasure operations. The WDREADY signal also controls multiplexer 141 to couple the output of latch 122 to become the $\overline{\text{WDLOBYTE}}$ signal during programming and erasure operations.

During erasure operation, latches 121–122 are reset by the CDERASE signal via an NOR gate 120. In addition, the WDREADY signal causes multiplexers 129 and 141 to select the output of latch 121 as the $\overline{\text{WDHIBYTE}}$ signal and the output of latch 122 as the $\overline{\text{WDLOBYTE}}$ signal. Latches 121–122 can also be reset by the power down PDPWRDN signal.

During read and programming operations, when the WDBYTE signal is logically low, NAND gates 126 an 138 are blocked from passing the AM1 signal and AM1 buffer 102 is blocked to output logical low $\overline{\text{WDHIBYTE}}$ and $\overline{\text{WDLOBYTE}}$ signals. When the WDBYTE signal is logically high, the AM1 signal is allowed to pass NAND gates 126 and 138, respectively. As can be seen from FIG. 6, the $\overline{\text{WDLOBYTE}}$ signal is in fact the complementary signal of the $\overline{\text{WDHIBYTE}}$ signal.

The output of NAND gate 126 is applied to latch 121 and the output of NAND gate 138 is applied to latch 122. When flash EPROM 20 is in the programming operation, the WDREADY signal causes the output of latch 121 to become the $\overline{\text{WDHIBYTE}}$ signal and the output of latch 122 to become the $\overline{\text{WDLOBYTE}}$ signal. When flash EPROM 20 is in the read operation, the WDREADY signal causes the output of NAND gate 126 to directly become the $\overline{\text{WDHIBYTE}}$ signal and the output of NAND gate 138 to directly become the $\overline{\text{WDLOBYTE}}$ signal. Latches 121–122 are used here to ensure that any change at the output of NAND gates 126 and 138 will not affect the $\overline{\text{WDHIBYTE}}$ signal and the $\overline{\text{WDLOBYTE}}$ signal during the programming operation.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory, comprising:

(A) a memory array;

(B) a plurality of data pads;

(C) data width control circuitry coupled to (1) the plurality of data pads and (2) the memory array, the data width control circuitry selectively coupling the plurality of data pads to the memory array;

(D) a data width configuration cell having a nonvolatile memory cell;

(E) data width select circuitry coupled to (1) the data width configuration cell and (2) the data width control circuitry, wherein when the data width configuration cell is in a first state, the data width select circuitry controls the data width control circuitry to couple the memory array to a first portion of the plurality of data pads such that the nonvolatile memory has a first data width, wherein when the data width configuration cell is in a second state, the data width select circuitry controls the data width control circuitry to couple the memory array to a second portion of the plurality of data pads such that the nonvolatile memory has a second data width.

2. The nonvolatile memory of claim 1, wherein the first portion of the plurality of data pads is word wide and the second portion of the plurality of data pads is byte wide.

3. The nonvolatile memory of claim 1, wherein the first portion of the plurality of data pads includes all of the plurality of data pads and the second portion of the plurality of data pads includes half of the plurality of data pads.

4. The nonvolatile memory of claim 1, wherein the first state of the data width configuration cell is a programmed state and the second state is an erased state.

5. The nonvolatile memory of claim 1, wherein the memory array includes a plurality of electrically erasable and electrically programmable nonvolatile memory cells.

6. The nonvolatile memory of claim 1, wherein the memory array includes a first sub-array and a second sub-array, wherein when the data width control circuitry couples the memory array to the second portion of the plurality of data pads, the data width select circuitry receives an address bit signal from one of the plurality of data pads not within the second portion of the plurality of data pads to control the data width control circuitry to selectively couple one of the first and second sub-arrays of the memory array to the second portion of the plurality of data pads.

7. The nonvolatile memory of claim 6, wherein the data width control circuitry further includes output multiplexing circuitry and input multiplexing circuitry, wherein the data width select circuitry controls the output multiplexing circuitry to selectively couple one of the first and second sub-arrays to the second portion of the plurality of data pads during reading of the nonvolatile memory, wherein the data width select circuitry controls the input multiplexing circuitry to selectively couple the second portion of the plurality of data pads to one of the first and second sub-arrays during programming of the nonvolatile memory.

8. The nonvolatile memory of claim 1, further comprising a data width control pad coupled to the data width select circuitry for providing a data width control signal to the data width select circuitry when the data width configuration cell is in the first state, wherein when the data width control signal is in a first voltage state, the data width select circuitry causes the data width control circuitry to couple the memory array to the first portion of the plurality of data pads, wherein when the data width control signal is in a second voltage state, the data width select circuitry causes the data width control circuitry to couple the memory array to the second portion of the plurality of data pads.

9. The nonvolatile memory of claim 8, wherein the memory array includes a first sub-array and a second sub-array, wherein when the data width control signal is in the second voltage state, the data width select circuitry receives an address bit signal from one of the plurality of data pads not within the second portion of the plurality of data pads to control the data width control circuitry to selectively couple one of the first and second sub-arrays of the memory array to the second portion of the plurality of data pads.

10. A nonvolatile memory, comprising:

(a) a first memory array;

(b) a second memory array;

(c) a first plurality of data pads;

(d) a second plurality of data pads;

(e) data width control circuitry coupled to (1) the first and second plurality of data pads and (2) the first and second memory arrays, the data width control circuitry selectively coupling the first and second plurality of data pad to the first and second memory arrays;

(f) a data width configuration cell having a nonvolatile memory cell;

(g) data width select circuitry coupled to (1) the data width configuration cell and (2) the data width control circuitry, wherein when the data width configuration cell is in a first state, the data width select circuitry controls the data width control circuitry to couple the first and second memory arrays to the first and second plurality of data pads such that the nonvolatile memory has a first data width, wherein when the data width configuration cell is in a second state, the data width select circuitry controls the data width control circuitry to couple the first and second memory arrays to the first plurality of data pads such that the nonvolatile memory has a second data width.

11. The nonvolatile memory of claim 10, further comprising a data width control pad coupled to the data width select circuitry for providing a data width control signal to the data width select circuitry when the data width configuration cell is in the first state, wherein when the data width control signal is in a first voltage state, the data width select circuitry causes the data width control circuitry to couple the first and second memory arrays to the first and second plurality of data pads, wherein when the data width control signal is in a second voltage state, the data width select circuitry causes the data width control circuitry to couple the first and second memory arrays to the first plurality of data pads.

12. The nonvolatile memory of claim 11, wherein when the data width control circuitry couples the first and second memory arrays to the first plurality of data pads, the data width select circuitry receives an address bit signal from one of the second plurality of data pads to control the data width control circuitry to selectively couple one of the first and second memory arrays to the first plurality of data pads.

13. The nonvolatile memory of claim 12, wherein the data width control circuitry further includes output multiplexing circuitry and input multiplexing circuitry, wherein the data width select circuitry controls the output multiplexing circuitry to selectively couple one of the first and second memory arrays to the first plurality of data pads during reading of the nonvolatile memory when the first and second memory arrays are to be coupled to the first plurality of data pads, wherein the data width select circuitry controls the input multiplexing circuitry to selectively couple the first plurality of data pads to one of the first and second memory arrays during programming of the nonvolatile memory when the first and second memory arrays are to be coupled to the first plurality of data pads.

14. The nonvolatile memory of claim 10, wherein the first data width is word wide and the second data width is byte wide.

15. The nonvolatile memory of claim 10, wherein the first state of the data width configuration cell is a programmed state and the second state is an erased state.

16. The nonvolatile memory of claim 10, wherein the memory array includes a plurality of electrically erasable and electrically programmable nonvolatile memory cells.

17. A computer system, comprising:

(A) a system bus;

(B) a central processing unit (CPU) coupled to the system bus;

(C) a plurality of peripheral devices, each of which being coupled to the system bus;

(D) a nonvolatile memory coupled to the system bus, wherein the nonvolatile memory further comprises
  (i) a first memory array;
  (ii) a second memory array;
  (iii) a first plurality of data pads;
  (iv) a second plurality of data pads;
  (v) data width control circuitry coupled to (1) the first and second plurality of data pads and (2) the first and second memory arrays, the data width control circuitry selectively coupling the first and second plurality of data pads to the first and second memory arrays;
  (vi) a data width configuration cell having a nonvolatile memory cell;
  (vii) data width select circuitry coupled to (1) the data width configuration cell and (2) the data width control circuitry, wherein when the data width configuration cell is in a first state, the data width select circuitry controls the data width control circuitry to couple the first and second memory arrays to the first and second plurality of data pads such that the nonvolatile memory has a first data width, wherein when the data width configuration cell is in a second state, the data width select circuitry controls the data width control circuitry to couple the first and second memory arrays to the first plurality of data pads such that the nonvolatile memory has a second data width.

18. The computer system of claim 17, further comprising a data width control pad coupled to the data width select circuitry for providing a data width control signal to the data width select circuitry when the data width configuration cell is in the first state, wherein when the data width control signal is in a first voltage state, the data width select circuitry causes the data width control circuitry to couple the first and second memory arrays to the first and second plurality of data pads, wherein when the data width control signal is in a second voltage state, the data width select circuitry causes the data width control circuitry to couple the first and second memory arrays to the first plurality of data pads.

19. The computer system of claim 18, wherein when the data width control circuitry couples the first and second memory arrays to the first plurality of data pads, the data width select circuitry receives an address bit signal from one of the second plurality of data pads to control the data width control circuitry to selectively couple one of the first and second memory arrays to the first plurality of data pads.

20. The computer system of claim 19, wherein the data width control circuitry further includes output multiplexing circuitry and input multiplexing circuitry, wherein the data width select circuitry controls the output multiplexing circuitry to selectively couple one of the first and second memory arrays to the first plurality of data pads during reading of the nonvolatile memory when the first and second memory arrays are to be coupled to the first plurality of data pads, wherein the data width select circuitry controls the input multiplexing circuitry to selectively couple the first plurality of data pads to one of the first and second memory arrays during programming of the nonvolatile memory when the first and second memory arrays are to be coupled to the first plurality of data pads.

21. The computer system of claim 20, wherein the first data width is word wide and the second data width is byte wide.

22. The computer system of claim 21, wherein the first state of the data width configuration cell is a programmed state and the second state is an erased state.

23. The computer system of claim 22, wherein the memory array includes a plurality of electrically erasable and electrically programmable nonvolatile memory cells.

24. A method of controlling a nonvolatile memory to switch between a first data width and a second data width, wherein the nonvolatile memory includes a first memory array, a second memory array, a first plurality of data pads, and a second plurality of data pads, wherein the method comprises the steps of:
  (A) providing a data width configuration cell having a nonvolatile memory cell for configuring data width of the nonvolatile memory, wherein when the data width configuration cell is in a first state, the nonvolatile memory is configured to have a first data width, wherein when the data width configuration cell is in a second state, the nonvolatile memory is configured to have a second data width;
  (B) determining the state of the data width configuration cell by data width select circuitry;
  (C) if the data width configuration cell is in the first state, then coupling the first and second memory arrays to the first and second plurality of data pads such that the nonvolatile memory has the first data width;
  (D) if the data width configuration cell is in the second state, then
    (i) receiving an address input signal from one of the second plurality of data pads by the data width select circuitry;
    (ii) selectively coupling one of the first and second memory arrays to the first plurality of data pads depending on the address input signal such that the nonvolatile memory has the second data width.

25. The method of claim 24, wherein the first data width is word wide and the second data width is byte wide.

26. The method of claim 24, wherein the step (C) further comprises the steps of:
  (a) receiving a control signal in the data width select mean, wherein the control signal can be in a first voltage state and a second voltage state;
  (b) if the control signal is in the first voltage state, then coupling the first memory array to the first plurality of data pads and the second memory array to the second plurality of data pads;
  (c) if the control signal is in the second voltage state, then
    (I) receiving an address input signal from one of the second plurality of data pads by the data width select circuitry; and
    (II) selectively coupling one of the first and second memory arrays to the first plurality of data pads depending on the address input signal.

27. The method of claim 26, wherein the first state of the data width configuration cell is a programmed state and the second state is an erased state, wherein the first voltage state of the control signal is logical high state and the second voltage state is logical low state.

* * * * *

UNITED STATES PATENT AND TRADEMARK OFFICE
CERTIFICATE OF CORRECTION

PATENT NO. : 5,504,875
DATED : April 2, 1996
INVENTOR(S) : Mills et al.

Page 1 of 2

It is certified that error appears in the above-indentified patent and that said Letters Patent is hereby corrected as shown below:

In column 1 at line 36 delete "mad" and insert --read--

In column 1 at line 43 delete "mad" and insert --read--

In column 1 at line 46 delete "mad" and insert --read--

In column 5 at line 15 delete "army" and insert --array--

In column 5 at line 22 delete "$D_0 14\ D_{15}$" and insert --$D_0$-$D_{15}$--

In column 5 at line 42 delete "army" and insert --array--

In column 5 at line 43 delete "army" and insert --array--

In column 5 at line 64 delete "army" and insert --array--

In column 5 at line 65 delete "army" and insert --array--

In column 6 at line 26 delete "am" and insert --are--

In column 7 at line 25 delete "am" and insert --are--

In column 7 at line 30 delete "army" and insert --array--

In column 7 at line 39 delete "am" and insert --are--

In column 8 at line 48 delete "army" and insert --array--

In column 9 at line 2 insert --pad 60 is also packaged as a $\overline{\text{BYTE}}$ pin for

UNITED STATES PATENT AND TRADEMARK OFFICE
CERTIFICATE OF CORRECTION

PATENT NO. : 5,504,875
DATED : April 2, 1996
INVENTOR(S) : Mills et al.

It is certified that error appears in the above-indentified patent and that said Letters Patent is hereby corrected as shown below:

receiving the external data width-- following "BYTE" and prior to "selection"

In column 9 at line 9 delete "the" and insert --that--

In column 9 at line 21 delete "logic 0" and insert --logic 40--

In column 9 at line 21 delete "WDBYTE" and insert --WDBYTE--

In column 9 at line 35 delete "WDHIYTE" and insert --WDHIBYTE--

In column 10 at line 38 delete "logic 41" and insert --logic 41a--

In column 12 at line 41 delete "OR" and insert --OR--

In column 13 at line 25 delete "WDBYTE" and insert --WDBYTE--

In column 13 at line 29 delete "WDBYTE" and insert --WDBYTE--

Signed and Sealed this

Fifth Day of November, 1996

Attest:

BRUCE LEHMAN

*Attesting Officer*     *Commissioner of Patents and Trademarks*